United States Patent
Yasuno (10) Patent No.: US 7,514,342 B2
(45) Date of Patent: Apr. 7, 2009

(54) METHOD AND APPARATUS FOR FORMING DEPOSITED FILM

(75) Inventor: Atsushi Yasuno, Nagahama (JP)

(73) Assignee: Canon Kabushiki Kaisha, Tokyo (JP)

( * ) Notice: Subject to any disclaimer, the term of this patent is extended or adjusted under 35 U.S.C. 154(b) by 340 days.

(21) Appl. No.: 11/133,187

(22) Filed: May 20, 2005

(65) Prior Publication Data

US 2005/0260831 A1 Nov. 24, 2005

(30) Foreign Application Priority Data

May 24, 2004 (JP) .............................. 2004-153045

(51) Int. Cl.
*H01L 21/205* (2006.01)
*C30B 29/06* (2006.01)
*C30B 28/14* (2006.01)

(52) U.S. Cl. ........................ 438/493; 117/89; 117/92; 117/105; 427/255.27; 427/255.18; 427/578

(58) Field of Classification Search ................ 438/493, 438/478, 584; 427/569, 585, 577, 578, 255.23, 427/255.28, 249.1, 249.15, 255.27, 255.35, 427/255.18; 117/88, 89, 92, 105
See application file for complete search history.

(56) References Cited

U.S. PATENT DOCUMENTS

| | | | | |
|---|---|---|---|---|
| 4,400,409 A | | 8/1983 | Izu et al. ........................ 427/39 |
| 5,557,215 A | * | 9/1996 | Saeki et al. ................... 324/765 |
| 5,699,223 A | * | 12/1997 | Mashiro et al. ............. 361/234 |
| 5,817,181 A | * | 10/1998 | Okamura et al. ............. 134/1.1 |
| 5,854,138 A | * | 12/1998 | Roth et al. ................... 438/714 |
| 5,900,161 A | * | 5/1999 | Doi ............................. 216/60 |
| 5,911,856 A | * | 6/1999 | Suzuki et al. ........... 204/192.13 |
| 5,948,485 A | * | 9/1999 | Amano et al. ............... 427/571 |
| 5,976,334 A | * | 11/1999 | Fu et al. ................. 204/298.19 |
| 6,051,503 A | * | 4/2000 | Bhardwaj et al. ........... 438/705 |
| 6,054,024 A | * | 4/2000 | Toyama et al. ......... 204/192.29 |
| 6,197,116 B1 | * | 3/2001 | Kosugi ........................ 118/712 |
| 6,248,220 B1 | * | 6/2001 | Seon ...................... 204/192.12 |
| 2005/0230351 A1 | * | 10/2005 | Tahara .......................... 216/67 |
| 2006/0065623 A1 | * | 3/2006 | Guiney et al. ................. 216/59 |
| 2006/0065631 A1 | * | 3/2006 | Cheng et al. .................. 216/86 |
| 2006/0065632 A1 | * | 3/2006 | Cheng et al. .................. 216/86 |
| 2007/0212896 A1 | * | 9/2007 | Olsen et al. ................. 438/758 |
| 2007/0218623 A1 | * | 9/2007 | Chua et al. .................. 438/240 |

FOREIGN PATENT DOCUMENTS

JP 07-335558 12/1995
JP 11-233443 * 8/1999

* cited by examiner

*Primary Examiner*—M. Wilczewski
(74) *Attorney, Agent, or Firm*—Fitzpatrick, Cella, Harper & Scinto (57) ABSTRACT

A method of forming a deposited film according to the present invention includes: introducing a starting gas into a discharge space in a reaction vessel; and applying electric power to generate discharge to decompose the starting gas, wherein, when a self-bias voltage value which is generated at an electrode applied with first electric power reaches a preset threshold, second electric power higher than the first electric power is applied to the electrode to change the self-bias voltage value to another self-bias voltage value larger in absolute value than the threshold, and the deposited film is formed.

1 Claim, 4 Drawing Sheets

METHOD AND APPARATUS FOR FORMING DEPOSITED FILM

BACKGROUND OF THE INVENTION

1. Field of the Invention

The present invention relates to a method and apparatus for forming a deposited film in which a thin film is formed on a substrate under a reduced pressure condition, and relates to, for example, a method and apparatus for forming a deposited film which are used for mass production of photovoltaic devices using amorphous silicon (amorphous semiconductor) or a non-single-crystal semiconductor such as microcrystalline silicon by plasma CVD or the like.

2. Related Background Art

Up to now, as regards photovoltaic devices used for solar cells and the like, attention has been paid on an amorphous material typified by amorphous silicon (a-Si:H) and a non-single-crystal semiconductor material such as microcrystalline silicon for the reasons that they are inexpensive, that they can be increased in size and reduced in thickness, that degrees of freedom thereof for composition are high, and that the electrical and optical characteristics thereof can be controlled in a wide range, and other reasons. In manufacturing the above-mentioned devices, an apparatus for forming a deposited film in which a thin film is formed by plasma CVD under a reduced pressure condition has been widely used in general and adopted in industries.

As regards the solar cells, the following points are essentially important: that a photoelectric conversion efficiency thereof is sufficiently high; it has excellent stability in its characteristic; and it can be manufactured through mass-production. Thus, it is required in manufacturing of the solar cells using a non-single-crystal semiconductor layer or the like that improvements be attempted in electrical, optical, photoconductive, and mechanical characteristics, fatigue characteristics to repetitive usage, and resistance to a usage environment of the solar cells to be manufactured. Also, it is required that the photovoltaic devices having a larger area and a semiconductor layer, which constitutes a solar cell, with a more uniform thickness and film quality are manufactured in mass-production at high speed by using a reproducible method.

The semiconductor layer, which serves as an important component in the solar cell, includes a semiconductor junction such as what is called a pn junction or a pin junction. In the case of using a thin film semiconductor such as a-Si, silane ($SiH_4$) as a starting gas, which contains an element serving as a dopant such as phosphine ($PH_3$) or diborane ($B_2H_6$), and the like are mixed to generate glow discharge so that the starting gas is decomposed, whereby the decomposed materials are attached and grown on a heated solid surface (plasma CVD). As a result, a semiconductor layer of desired conductivity type is obtained.

As described above, it has been known that semiconductor layers of desired conductivity type are sequentially stacked on a desired substrate, so that the layers can be easily formed to a semiconductor junction. In view of this, as a manufacturing method for a solar cell obtained by stacking non-single-crystal semiconductor layers, a method has been proposed in which: independent vessels for forming respective semiconductor layers are provided; the semiconductor layers are sequentially formed in the respective vessels; and resultingly, a stack of the semiconductor layers having a desired semiconductor junction is formed.

For example, the following method has been generally known in which: the independent vessels for forming semiconductor layers are coupled with each other through gate valves in a load lock system; and a substrate is moved to the vessels sequentially to form the respective semiconductor layers.

Further, as a method that remarkably improves mass-productivity, a continuous plasma CVD apparatus, which adopts a roll to roll method, is disclosed in U.S. Pat. No. 4,400,409. In this apparatus, a flexible substrate having a desired width and sufficient length is continuously conveyed through a conveying path provided in a plurality of glow discharge regions for performing glow discharge and forming semiconductor layers, and the semiconductor layers of required conductivity type are sequentially deposited on the substrate in the respective glow discharge regions, whereby a device having the plurality of semiconductor layers including a semiconductor junction is continuously manufactured.

However, such a mass-production apparatus for photovoltaic devices had a problem that generation of plasma over a large area for a long time gradually causes deposition of a film on an electrode surface, which varies a condition on electric power input. This means that the increase in thickness of the deposited film on the electrode surface changes an impedance of the electrode, which decreases a film formation speed.

As regards the above problem, Japanese Patent Application Laid-Open No. H11-233443 discloses a film forming method characterized in that input electric power is adjusted such that a self-bias voltage (Vdc) which is generated at a high-frequency electrode has a constant value. This method is effective in the initial period of film formation or in the case where the self-bias voltage has a small absolute value.

However, at the film formation or in the mass-production apparatus, which requires higher power application for raising a substrate processing speed or requires a long time process, control is difficult to be performed because an absolute value and a change amount of the self-bias voltage become large. This leads to the occurrence of the lowering in characteristics which accompanies the change in the self-bias voltage and the lowering of the film formation speed. Especially, the reduction in film thickness, which accompanies the lowering of the film formation speed at the time of formation of an i-type semiconductor layer, causes the decrease of a short-circuit current (Isc) as a solar cell characteristic, which largely affects the lowering of a conversion efficiency.

As described above, in the case of a film formation process with high electric power or for a long time in the prior art, it has been unavoidable that the condition change due to the film deposition (adhesion) on the electrode cannot be controlled, and the characteristics are gradually degraded with the elapse of time. That is, there has been a problem that, in the case where semiconductor devices are manufactured for a long time in mass production, variation in characteristics of the devices occurs with the elapse of time.

Moreover, in the prior art, the maintenance of a part and an electrode, on which a film is deposited, within a vacuum film formation vessel has been experimentally performed after film formation for a constant time in consideration of peeling of the deposited film and particles. However, the exact maintenance timing has not been determined in view of keeping the characteristics. Therefore, the lowering in characteristics occurs before the next maintenance in some cases resulting in one of the causes of the decrease in productivity.

Japanese Patent Application Laid-Open No. H07-335558 discloses a CVD apparatus provided with means for comparing a self-bias voltage with a set voltage to send a cleaning starting signal. In this application, description is made of the case of a discharge concentration phenomenon and the occurrence of particles. However, the above-mentioned lowering in the film formation speed occurs independent of those matters. That is, the lowering in characteristics may occur before the discharge concentration phenomenon and the occurrence of particles each exceed an allowable range thereof. Thus, the exact maintenance timing has not been realized in view of keeping the characteristics.

SUMMARY OF THE INVENTION

The present invention has been made in view of the above, and therefore has an object of providing a method and apparatus for forming a deposited film having high productivity in which film characteristics are prevented from lowering with the elapse of time due to film formation for a long time in the above-described deposited film forming apparatus and in which variation in characteristics of a deposited film in mass-production can be kept to a minimum. Further, the present invention particularly has an object of providing a method and apparatus for forming a deposited film having high productivity, particularly for stably manufacturing photovoltaic devices with a high photoelectric conversion efficiency.

Structures of the present invention, which have been made to attain the above-mentioned objects, are as follows.

According to one aspect of the present invention, there is provided a method of forming a deposited film, including: introducing a starting gas into a discharge space in a reaction vessel; and applying electric power to generate discharge to decompose the starting gas, wherein, when a self-bias voltage value which is generated at an electrode applied with first electric power reaches a preset threshold, second electric power higher than the first electric power is applied to the electrode to change the self-bias voltage value to another self-bias voltage value larger in absolute value than the threshold, and the deposited film is formed.

In further aspect of the present invention, there is provided the above method in which when the self-bias voltage value which is generated at the electrode applied with the first electric power is changed from a first self-bias voltage value to a second self-bias voltage value, and then, the second self-bias voltage value reaches the threshold, the second electric power higher than the first electric power is applied to the electrode to change the self-bias voltage value to another self-bias voltage value larger in absolute value than the first self-bias voltage value and the second self-bias voltage value, and the deposited film is formed.

According to another aspect of the present invention, there is provided a method of forming a deposited film, including: introducing a starting gas into a discharge space in a reaction vessel; and applying electric power to generate discharge to decompose the starting gas, wherein, when a self-bias voltage value which is generated at an electrode applied with electric power after introduction of the starting gas at a first flow rate reaches a preset threshold, the first flow rate is changed to a second flow rate larger than the first flow rate, and the deposited film is formed.

According to another aspect of the present invention, there is provided a method of forming a deposited film, including: introducing a starting gas into a discharge space in a reaction vessel; and applying electric power to generate discharge to decompose the starting gas, wherein, when a self-bias voltage value which is generated at an electrode applied with electric power at a first film formation temperature reaches a preset threshold, the first film formation temperature is changed to a second film formation temperature higher than the first film formation temperature, and the deposited film is formed.

According to another aspect of the present invention, there is provided a method of forming a deposited film, including: introducing a starting gas into a discharge space in a reaction vessel; and applying electric power to generate discharge to decompose the starting gas, wherein the deposited film is formed for a first film deposition time, and when a self-bias voltage value which is generated at an electrode applied with electric power reaches a preset threshold, the first film formation time is changed to a second film formation time longer than the first film formation time, and the deposited film is formed.

According to another aspect of the present invention, there is provided a method of forming a deposited film for manufacturing a non-single-crystal solar cell, the method including: introducing a starting gas into a discharge space in a reaction vessel; and applying electric power to generate discharge to decompose the starting gas, wherein based on a relation between a self-bias voltage value which is generated at an electrode applied with electric power and a short-circuit current of the non-single-crystal solar cell, a threshold of the self-bias voltage value at which the short-circuit current can be kept in a desired range is set; and wherein when the self-bias voltage value reaches the threshold, maintenance in the reaction vessel is performed.

According to another aspect of the present invention, there is provided an apparatus for forming a deposited film, including at least: means for introducing a starting gas into a discharge space in a reaction vessel; and means for applying electric power to generate discharge to decompose the starting gas, wherein the apparatus further includes: means for detecting a self-bias voltage value which is generated at an electrode applied with first electric power; means for comparing the self-bias voltage value with a preset threshold; and means for, when the self-bias voltage value reaches the threshold, changing the self-bias voltage value to another self-bias voltage value larger in absolute value than the threshold by application of second electric power higher than the first electric power.

In further aspect of the present invention, there is provided the above apparatus in which, when the self-bias voltage value which is generated at the electrode applied with the first electric power is changed from a first self-bias voltage value to a second self-bias voltage value, and then, the second self-bias voltage value reaches the threshold, the second electric power higher than the first electric power is applied to the electrode to change the self-bias voltage value to another self-bias voltage value larger in absolute value than the first self-bias voltage value and the second self-bias voltage value, and the deposited film is formed.

According to another aspect of the present invention, there is provided an apparatus for forming a deposited film, including at least: means for introducing a starting gas into a discharge space in a reaction vessel; and means for applying electric power to generate discharge to decompose the starting gas, wherein the apparatus further includes: means for detecting a self-bias voltage value which is generated at an electrode applied with electric power after introduction of the starting gas at a first flow rate; means for comparing the self-bias voltage value with a preset threshold; and means for changing the first flow rate of the starting gas to a second flow rate larger than the first flow rate when the self-bias voltage value reaches the threshold.

According to another aspect of the present invention, there is provided an apparatus for forming a deposited film, including at least: means for introducing a starting gas into a discharge space in a reaction vessel; and means for applying electric power to generate discharge to decompose the starting gas, wherein the apparatus further includes: means for detecting a self-bias voltage value which is generated at an electrode applied with electric power at a first film formation temperature; means for comparing the self-bias voltage value with a preset threshold; and means for changing the first film formation temperature to a second film formation temperature higher than the first film formation temperature when the self-bias voltage value reaches the threshold.

According to another aspect of the present invention, there is provided an apparatus for forming a deposited film, including at least: means for introducing a starting gas into a discharge space in a reaction vessel; and means for applying electric power to generate discharge to decompose the starting gas, wherein the apparatus further includes: means for forming the deposited film for a first film deposition time and detecting a self-bias voltage value which is generated at an electrode applied with electric power; means for comparing the self-bias voltage value with a preset threshold; and means for changing the first film formation time to a second film formation time longer than the first film formation time when the self-bias voltage value reaches the threshold, and the deposited film is formed.

According to the present invention, the film characteristics are prevented from lowering with the elapse of time due to the film formation for a long time in the deposited film forming apparatus, and the variation in film characteristics in mass-production can be kept to a minimum. Accordingly, in particular, the photovoltaic devices with a high photoelectric conversion efficiency can be stably manufactured with high productivity.

DESCRIPTION OF THE PREFERRED EMBODIMENTS

Hereinafter, the present invention will be described in detail with reference to the accompanying drawings. The following description does not limit a method and apparatus for forming a deposited film according to the present invention.

Figure 1:
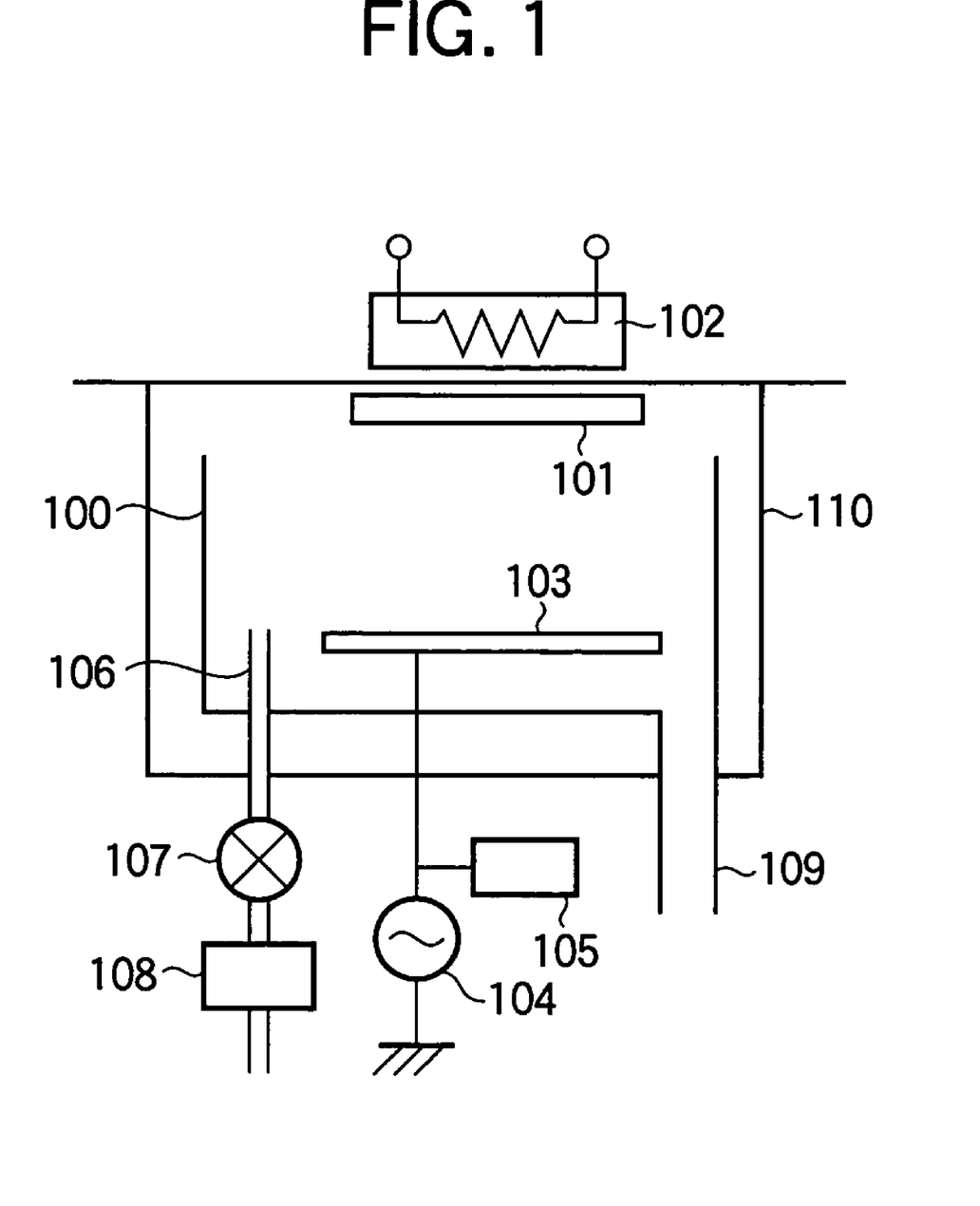
FIG. 1 is a schematic diagram showing an example of an apparatus for forming a deposited film for implementing a method of forming a deposited film according to the present invention.

FIG. 1 is a schematic diagram showing an example of the apparatus for forming a deposited film for implementing the method of forming a deposited film according to the present invention.

In FIG. 1, an inner reaction vessel 100, which serves as a discharge space, is arranged inside an outer reaction vessel 110. A substrate 101 is arranged so as to attach to a heater 102 provided to the outer reaction vessel 110, and vacuum exhaust is performed with an exhaust pipe 109 by using an exhaust apparatus not shown. Thereafter, the substrate 101 is heated to a desired temperature. After a substrate temperature become stable, a gas introducing valve 107 is opened, and a gas flow rate is adjusted by means of a massflow controller 108. Then, a starting gas containing silicon atoms is introduced into the inner reaction vessel 100 (discharge space) through a gas introducing pipe 106.

Next, high-frequency power is applied to a cathode electrode 103 from a high-frequency source 104 to generate plasma. At this point, walls of the vessels and the substrate are both grounded, so that the plasma is spread uniformly in the reaction vessels. Further, a self-bias voltage which is generated at the cathode electrode is always monitored by a self-bias voltage reader 105.

The self-bias voltage gradually changes as a deposition amount of a film on the cathode electrode increases. Especially in the case of a mass production apparatus, substrates to be processed are continuously inputted to a reaction vessel, so that film formation is performed for a long time. Thus, the film deposition amount on the cathode electrode is larger in the case of the substrate to be processed in the latter half of film formation than in the case of the substrate at the time of the start of film formation. That is, the substrate to be processed in the latter half of film formation is processed with largely changed self-bias value.

Specifically, it is considered that: the increase of the film deposition amount changes an impedance of the electrode; and a film formation speed is reduced along with the change of the self-bias voltage value. Therefore, there is a difference in thickness of a semiconductor layer between the substrate processed in the former half of film formation and the substrate processed in the latter half thereof. Particularly in a non-single-crystal solar cell, the decrease of a short-circuit current (Isc) in the latter haft of film formation, which is caused by the decrease in thickness of an i-type semiconductor layer, has been conspicuous.

In view of the above, according to the method of forming a deposited film according to the present invention, a predetermined film formation condition is changed to avoid the lowering of film characteristics to thereby maintain a satisfactory state at the point of time when the self-bias voltage value changes and reaches a predetermined threshold.

The threshold of the self-bias voltage value in the present invention is, in the case where the same film formation conditions are kept, set with respect to the self-bias voltage value that has changed after a predetermined time from the point of time when the film formation is started under the same film formation conditions. Hereinafter, description will be made of a case where the non-single-crystal solar cell is manufactured using the method and apparatus for forming a deposited film according to the present invention.

First, the relation between the self-bias voltage and the short-circuit current (Isc) is previously obtained based on the values obtained by measuring the self-bias voltage in a deposited film forming step and the short-circuit current (Isc) of the manufactured non-single-crystal solar cell every constant time, and the optimum range of the self-bias voltage value for obtaining desired characteristics is grasped in advance. Subsequently, the self-bias voltage is detected during film formation. The change of the film formation conditions is performed in order to maintain the characteristics at the time of point when the detected value reaches the threshold, which is set so as not to deviate from the optimum range of the self-bias voltage value under consideration.

Although the self-bias voltage always changes, it can be controlled constantly in the initial stage of film formation.

However, in the application of higher power for raising a substrate processing speed, in film formation that requires a long time process, and in a mass production apparatus, it is difficult to perform the control of the self-bias voltage because the absolute value and change amount of the self-bias voltage become large. Therefore, it is preferable that: not controlling the self-bias voltage at a constant level but monitoring a changing state of the self-bias voltage be performed; and predetermined film formation conditions be adjusted in a range in which the film characteristic, that is, the short-circuit current does not deviate from a desired value. Further, the present invention is preferably applied to the deposited film formation using the self-bias voltage ranging from −300 V to 300 V. Under the condition that the self-bias voltage value deviates from this range, there is a strong possibility that desired characteristics cannot be obtained even when adjustment of the conditions is carried out due to the occurrence of a discharge abnormality such as a spark or deterioration in film quality.

Here, description will be made of a film formation condition to be changed. As described above, the change of the self-bias voltage value indicates the lowering of the film formation speed. Thus, as regards the condition that is changed when the self-bias voltage value reaches the threshold, it is effective that the power to be applied is increased to raise the film formation speed.

At this point, in either case of a plus value and a minus value of the self-bias voltage, an absolute value of the self-bias voltage changes to be larger than that of the set threshold when the power is increased. For example, in the case where film formation is started with the self-bias voltage having a plus value, the absolute value of the self-bias voltage always changes to be smaller with the elapse of the film formation time. However, the absolute value returns in a plus direction when the power is increased, and thus, becomes larger than that of the threshold. Further, in the case where film formation is started with the self-bias voltage having a minus value, the self-bias voltage value changes in a minus direction, that is, a direction in which the absolute value becomes larger with the elapse of a film formation time. When the power is increased, the self-bias voltage value further changes in the minus direction. Also in this case, the absolute value of the self-bias voltage changes to be larger than that of the threshold. Particularly in the case where film formation is started with the self-bias voltage having a minus value, when it is supposed that the self-bias voltage value before the increase in power has changed from, for example, A to B, the self-bias voltage after the increase in power has a larger absolute value than those of both A and B.

As regards the condition change except for the above-described change in the application power, there is a method of increasing a flow rate of a starting gas. For example, in the case of an amorphous or microcrystalline silicon film, when the self-bias voltage reaches the threshold, the flow rate of the starting gas containing silicon atoms is increased to raise the film formation speed, thereby maintaining film characteristics.

Further, a method of changing a condition of a film formation temperature is also effective. In this method, the lowering in characteristics due to the lowering in thickness is compensated with not the increase of the film formation speed but the change in film quality. In the case of, for example, an i-type semiconductor layer composed of amorphous silicon, a raise in film formation temperature reduces a hydrogen amount in a film to decrease an optical band gap. Thus, the short-circuit current (Isc) increases. As a result, the lowering of the short-circuit current due to the reduction in film thickness can be compensated. Here, the film formation temperature in the present invention indicates any one of a substrate temperature, electrode temperature, wall surface temperature, and ambient temperature or the average temperature of those.

Besides, the following method is also effective in which a film formation time is extended without changing a film formation speed to compensate for insufficiency of film thickness. That is, it is sufficient that: the reduction amounts of the film formation speed, film thickness, and short-circuit current (Isc) due to the change in the self-bias voltage be obtained in advance; and the film deposition time be extended such that the thickness and the short-circuit current (Isc) each finally reaches a desired value, while keeping the condition of the decreased film formation speed when the self-bias voltage reaches the threshold.

Hereinabove, description has been made of the film formation condition that is changed when the self-bias voltage value reaches the predetermined threshold. In the present invention, a plurality of conditions may be changed at once by combining the above conditions as the occasion demands.

Further, in the case where, after the film formation condition is changed once, the condition needs to be changed again to maintain characteristics, the threshold of the self-bias voltage at the second time of the condition change is not necessarily the same as the threshold at the first time of the condition change. It is sufficient that: the relation between the self-bias voltage and the film characteristics under the film formation condition at each time be previously obtained; and the range of the self-bias voltage value and the threshold, which are most suitable for obtaining desired film characteristics, be set depending conditions.

Moreover, there may be adopted a method in which a plurality of thresholds of the self-bias voltage are predetermined; and the separate conditions are changed with the differently set thresholds. Also in this case, it is sufficient that: the degree of the effect of the condition to be changed on characteristics be previously obtained; and the optimum condition be applied.

As described above, the film deposited formation condition is changed at the point of time when the self-bias voltage value reaches the predetermined threshold. Thus, there is avoided the lowering in characteristics with the elapse of time which accompanies the change of the self-bias voltage value due to the long time film formation in the deposited film forming apparatus. As a result, variation in film characteristics at the time of mass production can be held to a minimum.

Further, in the case where the change of the film deposition conditions reduces the effect on the characteristics so that desired characteristics cannot be recovered, it is preferable that: the maintenance of the apparatus, reaction vessels, and cathodes be performed; and the deposited film attached to them be removed by sand blasting or etching. The maintenance returns the self-bias voltage value of the electrode and the characteristics of the deposited film at the time of discharge to their initial states. Therefore, the method of forming a deposited film according to the present invention becomes effective again. Accordingly, it is sufficient that: the self-bias voltage value, at which the desired characteristics are not obtained, be previously obtained; and the maintenance be performed in consideration of the value when the value reaches the set threshold.

Here, in the prior art, the timing of the maintenance has been set in accordance with the peeling of the attached film, the occurrence of particles, and the contamination of the reaction vessels. However, the above-described lowering of film characteristics occurs independent of those matters. That is, the lowering of characteristics may occur before the peeling of the deposited film and the occurrence of particles each exceed an allowable range thereof. The maintenance timing in the prior art has not been the exact maintenance timing from the viewpoint of keeping film characteristics.

Therefore, in the present invention, the relation between the self-bias voltage and the short-circuit current is previously obtained, and the threshold of the self-bias voltage is set such that the short-circuit current is in a desired range, whereby the more exact maintenance timing can be determined with the aim of not lowering the film characteristics.

Figure 2:
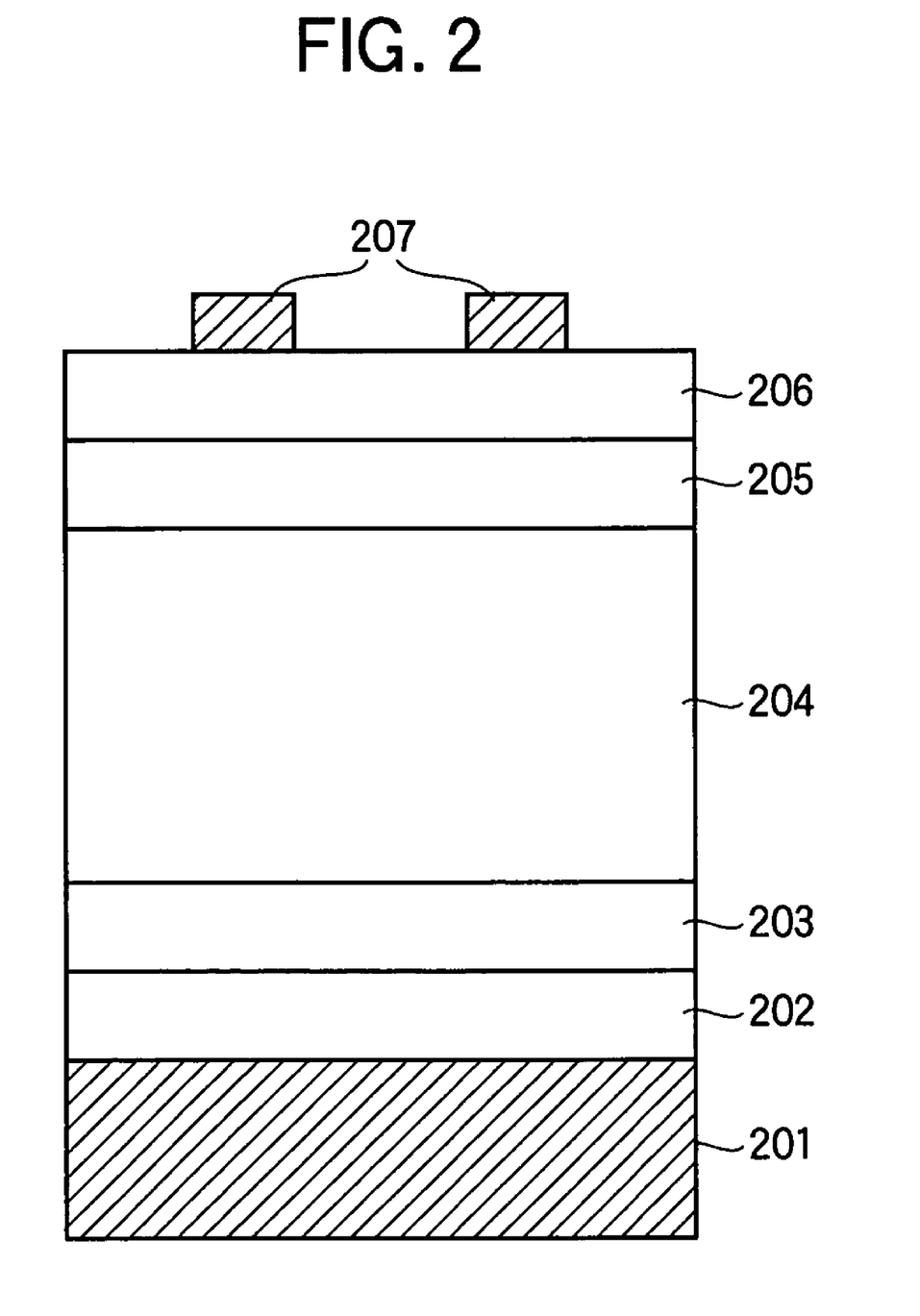
FIG. 2 is an explanatory diagram schematically showing a structure of a pin type non-single-crystal solar cell manufactured with the apparatus for forming a deposited film according to the present invention.

FIG. 2 schematically shows a pin type non-single-crystal solar cell that can be manufactured with the method and apparatus for forming a deposited film according to the present invention. FIG. 2 shows the solar cell having a structure in which light is incident from an upper part of the figure. In this figure, reference numeral 201 denotes a substrate; 202, lower electrode; 203, n-type semiconductor layer; 204, i-type semiconductor layer; 205, p-type semiconductor layer; 206, upper electrode; and 207, collecting electrode.

(Substrate)

The suitable substrate 201 on which the semiconductor layers are to be deposited may be composed of either a single crystal or a non-single crystal, and may be also composed of either a conductive material or an electrically insulating material. Further, the substrate 201 may be either translucent or non-translucent. However, the substrate preferably has a little deformation and distortion and a desired strength.

Specifically, the substrate includes thin plates composed of metals such as Fe, Ni, Cr, Al, Mo, Au, Nb, Ta, V, Ti, Pt, and Pb and alloys of those metals, for example, a sheet composed of brass, and stainless steel, and their composites; films or sheets composed of heat-resisting resins such as polyester, polyethylene, polycarbonate, cellulose acetate, polypropylene, polyvinyl chloride, polyvinylidene chloride, polystyrene, polyamide, polyimide, and epoxy, or composites of these resins and glass fiber, carbon fiber, boric fiber, metal fiber, and the like; and those metal sheets, resin sheets and the like surface-coated with a thin film of a different metal material and/or an insulating thin film of $SiO_2$, $Si_3N_4$, $Al_2O_3$, AlN or the like by sputtering, vapor evaporation, and metal plating; glass; and ceramics.

In the case of an electrical conductive substrate of a metal or the like, the substrate may be directly used as an electrode for taking out a current.

In the case of the electrically insulating substrate of a synthetic resin or the like, it is preferable that a surface on which a deposited film is to be formed be surface-treated with what is called a metallic element selected from the group consisting of Al, Ag, Pt, Au, Ni, Ti, Mo, W, Fe, V, Cr, Cu, stainless steel, brass, nichrome, $SnO_2$, $In_2O_3$, ZnO, and ITO or an alloy thereof and a transparent conductive oxide (TCO), by using a method such as metal plating, evaporation, or sputtering, thereby forming the electrode for taking out a current. Of course, even when the substrate is the electrical conductive substrate of a metal or the like, a layer of a different metal and the like may be provided on the substrate surface on which the deposited film is to be formed for the purpose of raising a reflectance of long wavelength light on the substrate surface, the purpose of preventing mutual diffusion of structural elements between the substrate material and the deposited film, or other purposes.

Further, the substrate may have what is called a smooth surface or a minute convexo-concave surface in terms of surface property. In the case of the minute convexo-concave surface, the convexo-concave shape is spherical, conical, pyramidal, or the like, and the maximum height (Rmax) is preferably 50 nm to 500 nm. Therefore, light reflection on the surface becomes diffuse reflection, which leads to the increase of an optical path length of reflected light on the surface. A thickness of the substrate is appropriately determined so as to be able to form a desired photovoltaic device, and is usually set to 10 μm or more from the viewpoint of manufacturing and usage, mechanical strength and the like of the substrate.

In the non-single-crystal solar cell, a suitable electrode is selected to be used depending on its structural form. A lower electrode, upper electrode (transparent electrode), and collecting electrode can be cited for the electrode. The upper electrode here indicates an electrode provided on the side of an incidence of light, and the lower electrode indicates one provided so as to oppose the upper electrode with interposition of a semiconductor layer therebetween. Hereinafter, those electrodes will be explained in detail.

(Lower Electrode)

The lower electrode 202 is provided between the substrate 201 and the n-type semiconductor layer 203. However, in the case where the substrate 201 is conductive, the substrate can also serve as the lower electrode. In the case where, even if the substrate 201 is conductive, a sheet resistance value thereof is high, the electrode 202 may be provided as an electrode having a low resistance for taking out a current or for the purpose of enhancing the reflectance on the substrate surface and attaining effective utilization of incident light.

The electrode materials include metals such as Ag, Au, Pt, Ni, Cr, Cu, Al, Ti, Zn, Mo, and W and alloys of these elements. A thin film made of any of the metals and alloys is formed by vacuum evaporation, electron-beam evaporation, sputtering, or the like. Further, attention has to be paid such that the formed metal thin film does not work as a resistance component against an output of the photovoltaic device.

Although not shown in the figure, a diffusion inhibiting layer made of conductive zinc oxide or the like may be provided between the lower electrode 202 and the n-type semiconductor layer 203. As regards the effect of the diffusion inhibiting layer, the metallic element constituting the lower electrode 202 is prevented from diffusing into the n-type semiconductor layer. Besides, there can be given the following effects that some resistance of the diffusion inhibiting layer prevents short circuit which is generated due to a defect of a pin-hole or the like between the lower electrode 202 and the upper electrode 206 provided with interposition of the semiconductor layers therebetween; and that the diffusion inhibiting layer generates multiple interference which arises from a thin film to thereby confine the incident light in the photovoltaic device and other effects.

(Upper Electrode (Transparent Electrode))

The transparent electrode 206 desirably has a light transmittance of 85% or more in order that the light from the sun, cool white fluorescent lamp, or the like is efficiently absorbed into the semiconductor layer. Further, the transparent electrode 206 desirably has a sheet resistance value of 300 Ω/☐ or less in order not to work as a resistance component against the output of the photovoltaic device from the viewpoint of electrical property. The materials having the above characteristics include metallic oxides such as $SnO_2$, $In_2O_3$, ZnO, CdO, $CdSnO_4$, and ITO ($In_2O_3$+$SnO_2$), a thin film of a metal which is obtained by forming a metal such as Au, Al, or Cu into an extremely thin and translucent film.

The transparent electrode 206 is stacked on the p-type semiconductor layer 205 as shown in FIG. 2. Thus, the layers preferably has high adhesion property to each other. Resistance heating evaporation, electron-beam heating evaporation, sputtering, spraying, and the like may be used for forming those layers, and are appropriately selected depending on a desired case.

(Collecting Electrode)

The collecting electrode 207 is provided on the transparent electrode 206 for the purpose of reducing a surface resistance value of the transparent electrode 206. The electrode materials include metals such as Ag, Cr, Ni, Al, Ag, Au, Ti, Pt, Cu, Mo, and W, and alloys of these metals. The stacked thin films of these metals and alloys can be used. Further, the shape and area of the electrode are properly designed in order that an amount of incident light to the semiconductor layer is sufficiently secured.

For example, the shape is uniformly spread to a light-receiving surface of the photovoltaic device, and the area corresponds to preferably 15% or less of the light-receiving area, more preferably 10% or less thereof. Further, a sheet resistance value of the electrode is preferably 50 Ω/□ or less, more preferably 10 Ω/□ or less.

(Semiconductor Layer)

The semiconductor layers 203, 204 and 205 are formed by an usual thin film forming process, and can be formed by using a known method such as evaporation, sputtering, high-frequency plasma CVD, microwave induced plasma CVD, ECR, thermal CVD, or LPCVD depending on a desired case. Plasma CVD is preferably used as a method adopted in an industrial manner in which a starting gas is decomposed by plasma to be deposited on a substrate.

Further, a batch type apparatus, continuous film forming apparatus, or the like can be used as a reaction apparatus in accordance with a desired case. In the case of manufacturing a valence controlled semiconductor, a $PH_3$ gas, $B_2H_6$ gas and the like, which respectively contains phosphorous, boron and the like as constituent atoms are decomposed at the same time.

(I-Type Semiconductor Layer)

The semiconductor materials for constituting the i-type semiconductor layer, which are favorably used in the solar cell of the present invention, include the so-called IV group alloy-based semiconductor materials such as a-SiGe:H, a-SiGe:F, and a-SiGe:H:F in the case of forming an i-type semiconductor layer made of amorphous silicon germanium. Further, in a tandem solar cell structure composed of stacked unit device constitutions, except for amorphous silicon germanium, the semiconductor materials for constituting the i-type semiconductor layer include the so-called IV group and IV group alloy system semiconductor materials such as a-Si:H, a-Si:F, a-Si:H:F, a-SiC:H, a-SiC:F, a-SiC:H:F, poly-Si:H, poly-Si:F, and poly-Si:H:F; the so-called compound semiconductor materials composed of the III-V group and the II-VI group; and the like.

Examples of the starting gas used for CVD include chain or cyclic silane compounds containing silicon. Specific examples thereof include $SiH_4$, $SiF_4$, $(SiF_2)_5$, $(SiF_2)_6$, $(SiF_2)_4$, $Si_2F_6$, $Si_3F_8$, $SiHF_3$, $SiH_2F_2$, $Si_2H_2F_4$, $Si_2H_3F_3$, $SiCl_4$, $(SiCl_2)_5$, $SiBr_4$, $(SiBr_2)_5$, $SiCl_6$, $SiHCl_3$, $SiHBr_2$, $SiH_2Cl_2$, and $SiCl_3F_3$ in a gaseous state or in a state easy to be gasified.

Alternatively, the examples of the starting gas as compounds containing germanium elements include chain germanium, chain germanium halide, cyclic germanium halide, cyclic germanium halide, chain or cyclic germanium compounds, and organic germanium compounds each having an alkyl group and the like. Specifically, $GeH_4$, $Ge_2H_6$, $Ge_3H_8$, n-$Ge_4H_{10}$, t-$Ge_4H_{10}$, $Ge_5H_{10}$, $GeH_3Cl$, $GeH_2F_2$, $Ge(CH_3)_4$, $Ge(C_2H_5)_4$, $Ge(C_6H_5)_4$, $Ge(CH_3)_2F_2$, $GeF_2$, and $GeF_4$ are included.

(P-Type Semiconductor Layer and N-Type Semiconductor Layer)

The semiconductor materials for constituting the p-type or n-type semiconductor layer, which are favorably used in the solar cell of the present invention, are obtained by doping a valence control agent to the above-described semiconductor materials constituting the i-type semiconductor layer. The same method for forming the i-type semiconductor layer can be suitably used for forming the p-type or n-type semiconductor layer. As the materials for forming the p-type semiconductor layer, in the case of obtaining a deposited film of the IV group in the periodic table, compounds containing the element in the III group of the periodic table are used as the valence control agent for obtaining the p-type semiconductor. B is included in the element of the III group of the periodic table. Specific examples of compounds each containing B include $BF_3$, $B_2H_6$, $B_4H_{10}$, $B_5H_9$, $B_5H_{11}$, $B_6H_{10}$, $B(CH_3)_3$, $B(C_2H_5)_3$, and $B_6H_{12}$.

Compounds containing elements of the V group of the periodic table are used as valence control agent to obtain n-type semiconductors. P and N are included in the V group, and specific examples of compounds containing these elements include $N_2$, $NH_3$, $N_2H_5N_3$, $N_2H_4$, $NH_4N_3$, $PH_3$, $P(CH_3)_3$, $P(C_2H_5)_3$, $P(C_3H_7)_3$, $P(C_4H_9)_3$, $P(OCH_3)_3$, $P(OC_2H_5)_3$, $P(OC_3H_7)_3$, $P(OC_4H_9)_3$, $P(SCN)_3$, and $P_2H_4$.

Hereinafter, examples of the method and apparatus for forming a deposited film according to the present invention are shown. However, the contents of the present invention are not limited to the following Examples.

EXAMPLE 1

Figure 3:
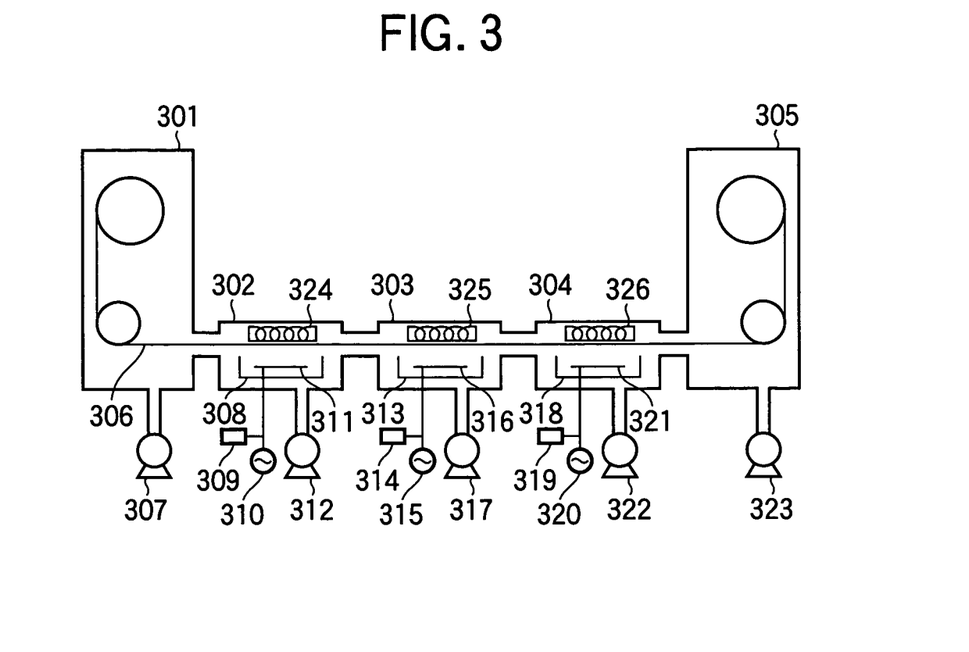
FIG. 3 is a schematic diagram showing an example of the apparatus for forming a deposited film according to the present invention.

Hereinafter, description will be made of a method of continuously manufacturing the non-single-crystal solar cell as shown in FIG. 2 with the use of the apparatus as shown in FIG. 3.

FIG. 3 is a schematic diagram showing an example of the apparatus for forming a deposited film according to the present invention with the purpose of continuously manufacturing a non-single-crystal solar cell. The apparatus has a structure in which a belt-shaped substrate 306, a substrate-delivering chamber 301, a substrate-winding chamber 305, a vessel 302 for forming an n-type semiconductor layer, a vessel 303 for forming an i-type semiconductor layer, and a vessel 304 for forming a p-type semiconductor layer are connected with one another through gas gates. Reference numerals 307, 312, 317, 322, and 323 denote exhaust pumps, and reference numerals 311, 316, and 321 denote cathode electrodes, which are connected to power sources 310, 315, and 320, respectively. Further, the self-bias voltages generated at the electrodes can be read by self-bias voltage readers 309, 314, and 319, respectively.

The reaction vessels 302, 303, and 304 have inner reaction vessels 308, 313, and 318 in their inner sides, respectively. Infrared lamp heaters 324, 325, and 326 are provided in spaces opposing to film formation spaces, respectively with interposition of the belt-shaped electrode 306 therebetween, and a temperature control system not shown performs control to obtain a desired temperature.

First, a bobbin wound with the belt-shaped substrate 306 (with a width of 300 nm and a thickness of 0.2 mm) formed of SUS430BA, which had been subjected to degreasing and cleaning sufficiently and then subjected to vapor deposition by sputtering to form a silver thin film of 100 nm and a ZnO thin film of 1 μm thereon as a lower electrode, was set in the vacuum vessel 301 having a substrate-delivering mechanism in the deposited film forming apparatus. The belt-shaped substrate 306 was passed through the vessel 302 for forming an n-type semiconductor layer, the vessel 303 for forming an i-type semiconductor layer, the vessel 304 for forming a p-type semiconductor layer, and the vacuum vessel 305 having a belt-shaped substrate-winding mechanism, and tension adjustment was performed to the extent of no slack. The distance between the substrate and the cathode electrode at this time was set to 20 mm.

Next, the vacuum vessels 301, 302, 303, 304, and 305 were exhausted to $1 \times 10^{-4}$ Pa or less by means of the exhaust pumps 307, 312, 317, 322, and 323, respectively. In heat treatment before film formation, He of 500 sccm was introduced into each of the vacuum vessels 302, 303, and 304 through a gas introducing pipe not shown, and an opening of a throttle valve was adjusted to set an internal pressure of each of the vacuum vessels 301, 302, 303, 304, and 305 to 130 Pa, whereby the respective vacuum vessels were exhausted by the exhaust pumps, respectively. Here, the "sccm" indicates a unit of a flow rate, and 1 sccm=1 $cm^3$/min (normal condition) is established. Hereinafter, the unit of a flow rate is represented by sccm. Thereafter, the belt-shaped substrate and the members inside the vacuum vessels were heated to 400° C. by means of the heating lamp heaters 324, 325, and 326, and this state was kept for 1 hour.

Next, as preparation for forming an n-type semiconductor layer, a temperature control apparatus (not shown) was set to attain a temperature indicated value of 270° C., and the belt-shaped substrate 306 was heated by the infrared lamp heater 324. An $SiH_4$ gas at 100 sccm, $PH_3/H_2$ (1%) gas at 500 sccm, and $H_2$ gas at 700 sccm were introduced into the inner reaction vessel 308 through a gas introducing port not shown. An opening of a not-shown conductance adjusting valve was adjusted to set an internal pressure of a discharge chamber to 130 Pa, and the discharge chamber was exhausted with the vacuum pump 312. An output value of the RF (13.56 MHz) power source 310 was set to 100 W, and discharge was generated in the inner reaction vessel 308 through the electrode 311. The self-bias voltage generated at the electrode 311 was monitored by the self-bias voltage reader 309.

Next, as preparation for forming an i-type semiconductor layer, a temperature control apparatus (not shown) was set to attain a temperature indicated value of 300° C., and the belt-shaped substrate 306 was heated by the infrared lamp heater 325. An $SiH_4$ gas at 800 sccm, $GeH_4$ gas at 900 sccm, and $H_2$ gas at 3,000 sccm were introduced into the inner reaction vessel 313 through a gas introducing port not shown. The opening degree of the conductance adjusting valve was adjusted to set the internal pressure of the discharge chamber to 130 Pa, and the discharge chamber was exhausted with the vacuum pump 317. An output value of the RF (13.56 MHz) power source 315 was set to 1,000 W, and discharge was generated in the inner reaction vessel 313 through the electrode 316. The self-bias voltage generated at the electrode 316 was monitored by the self-bias voltage reader 314.

Next, as preparation for forming a p-type semiconductor layer, a temperature control apparatus (not shown) was set to attain a temperature indicated value of 150° C., and the belt-shaped substrate 306 was heated by the infrared lamp heater 326. An $SiH_4$ gas at 10 sccm, $BF_3/H_2$ (1%) gas at 500 sccm, and $H_2$ gas at 5,000 sccm were introduced into the inner reaction vessel 318 through a gas introducing port not shown. The opening degree of the conductance adjusting valve was adjusted to set the internal pressure of the discharge chamber to 130 Pa, and the vessel 318 was exhausted with the vacuum pump 322. An output value of the RF power source 320 was set to 2,000 W, and discharge was generated in the inner reaction vessel 318 through the electrode 321. The self-bias voltage generated at the electrode 321 was monitored by the self-bias voltage reader 319.

After the preparations for the respective layers, subsequently, the belt-shaped substrate 306 was conveyed at a speed of 1,000 mm/min, and the n-type semiconductor layer, i-type semiconductor layer, and p-type semiconductor layer started to be formed on the belt-shaped substrate. Here, the self-bias voltage value of the i-type semiconductor layer after 30 minutes from the start of film formation was −0.2 V.

After 10 hours from the start of film formation, the output value of the RF power source 315 was changed from 1,000 W, which was the previous value, to 1,100 W at the point of time when the self-bias voltage value of the i-type semiconductor layer reached −1.5 V (that is, the threshold was set to −1.5 V in this example). After the setting change, the self-bias voltage became −2.2 V, and the film formation was continued.

After one roll of the belt-shaped substrate was conveyed, the entire plasma, the entire gas supply, the entire electrification of the lamp heaters, and the conveyance of the belt-shaped substrate were stopped. Subsequently, an $N_2$ gas for a chamber leak was introduced into the chamber (through a introducing member not shown) to return a pressure to an atmospheric pressure. Then, the belt-shaped substrate was taken out of the vacuum vessel 305.

ITO ($In_2O_3+SnO_2$) for forming the transparent electrode was vapor-deposited by 100 nm in thickness on the p-type semiconductor layer of the taken-out belt-shaped substrate. Further, Al for forming the collecting electrode was vapor-deposited by 1 μm in thickness thereon. Accordingly, the solar cell was manufactured.

COMPARATIVE EXAMPLE 1

In Comparative Example 1, a non-single-crystal solar cell was manufactured in the same way as in Example 1 except that the setting change of the input power was not performed after approximately 10 hours from the start of film formation in the film formation of the i-type semiconductor layer. The self-bias voltage value of the i-type semiconductor layer in Comparative Example 1 gradually lowered from −0.2 V after 30 minutes from the start of film formation until the end of film formation.

Figure 4:
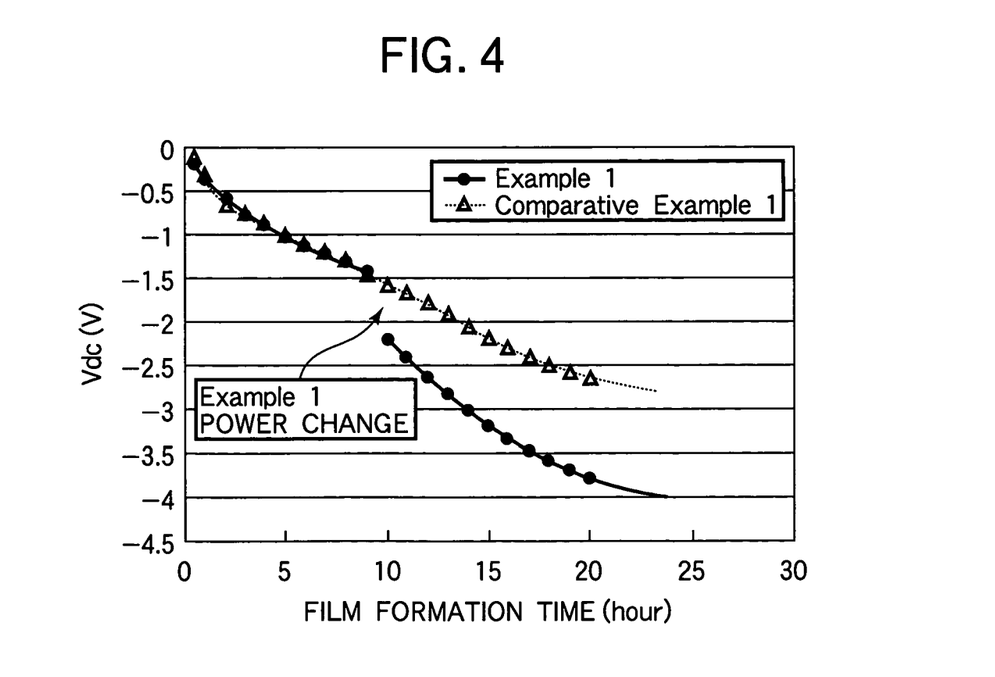
FIG. 4 is a graph in which self-bias voltage values transited in the formation of an i-type semiconductor layer in each of Example 1 and Comparative Example 1 are plotted every constant film formation time.

Here, FIG. 4 shows the transition of the self-bias voltages in Example 1 and Comparative Example 1. An axis of ordinate indicates a self-bias voltage Vdc (V), and an axis of abscissa indicates a film formation time. It can be confirmed that in Example 1 the self-bias voltage value changed in a negative direction so that its absolute value became larger after the change of the input power.

As evaluation, samples of Example 1 and Comparative Example 1 were irradiated with light of a solar spectrum of AM-1.5 with a strength of 100 mW/$cm^2$ using a solar simulator, and voltage-current curves were obtained. Resultingly, initial conversion efficiencies of the solar cells were measured.

Figure 5:
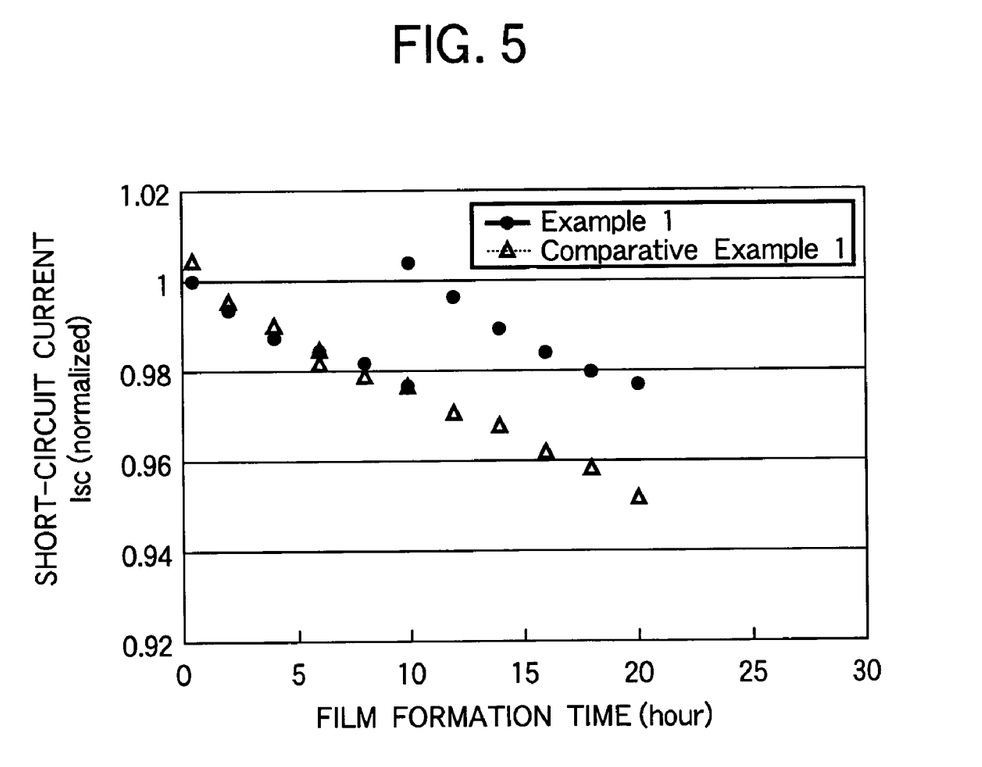
FIG. 5 is a graph in which normalized values of a short-circuit current Isc of a solar cell element manufactured in each of Example 1 and Comparative Example 1 are plotted every constant film formation time.

In FIG. 5, the solar cells obtained in Example 1 and Comparative Example 1 are sampled every constant film formation time, and short-circuit currents (Isc) thereof are plotted. A short-circuit current (Isc) corresponds to an axis of ordinate, and a film formation time corresponds to an axis of abscissa. Here, the short-circuit current (Isc) (normalized) is expressed through normalization in which the short-circuit current after 30 minutes from the start of film formation in Example 1 is taken as 1.

The solar cell manufactured in Comparative Example 1 has a tendency that the short-circuit current decreases with the lapse of the film formation time. In contrast, in the solar cell manufactured in Example 1, the short-circuit current was recovered after the change of the input power after 10 hours from the start of film formation. As a result, the effect according to the present invention was confirmed.

EXAMPLE 2

In Example 2, a non-single-crystal solar cell was manufactured in the same way as in Example 1 except that the film formation condition of the i-type semiconductor layer was in accordance with the following method.

In this example, after about 10 hours from the start of film formation, when the self-bias voltage value of the i-type semiconductor layer reached −1.5 V, the condition of a flow rate of an $SiH_4$ gas was changed from 800 sccm to 850 sccm without changing the input power. Then, the film formation was continued. After the film formation for one roll was completed, the electrodes were formed similarly as in Example 1 to manufacture the solar cell.

The evaluation of the solar cell was performed in the same way as in Example 1. As a result, similarly to the result in Example 1, the short-circuit current of the solar cell manufactured in Example 2 was recovered after the change of the $SiH_4$ gas flow rate after 10 hours from the start of film formation. Accordingly, the effect according to the present invention was confirmed.

EXAMPLE 3

In Example 3, a non-single-crystal solar cell was manufactured in the same way as in Example 1 except that the film formation condition of the i-type semiconductor layer was in accordance with the following method.

In this example, after about 10 hours from the start of film formation, when the self-bias voltage value of the i-type semiconductor layer reached −1.5 V, the condition of a temperature indicated value of the infrared lamp heater 325 was changed from 300° C. to 320° C. without changing the input power. Then, the film formation was continued. After the film formation for one roll was completed, the electrodes were formed similarly as in Example 1 to manufacture the solar cell.

The evaluation of the solar cell was performed in the same way as in Example 1. As a result, similarly to the result in Example 1, the short-circuit current of the solar cell manufactured in Example 3 was recovered after the change of the temperature of the infrared lamp heater 325 after 10 hours from the start of film formation. Accordingly, the effect according to the present invention was confirmed.

EXAMPLE 4

In Example 4, a non-single-crystal solar cell was manufactured in the same way as in Example 1 except that the film formation condition of the i-type semiconductor layer and the conveying speed of the belt-shaped substrate were in accordance with the following method.

In this example, after about 10 hours from the start of film formation, when the self-bias voltage value of the i-type semiconductor layer reached −1.5 V, the condition of the conveying speed of the belt-shaped substrate was changed from 1,000 mm/min to 950 mm/min without changing the input power. Then, the film formation was continued. This means that a film formation time for the semiconductor layer was extended. In this case, the $SiH_4$ gas flow rate was adjusted to decrease in order to keep a constant thickness of each of the n-type and p-type semiconductor layers. After the film formation for one roll was completed, the electrodes were formed similarly as in Example 1 to manufacture the solar cell.

The evaluation of the solar cell was performed in the same way as in Example 1. As a result, similarly to the result from Example 1, the short-circuit current of the solar cell manufactured in Example 4 was recovered after the change of the conveying speed of the belt-shaped substrate after 10 hours from the start of film formation. Accordingly, the effect according to the present invention was confirmed.

EXAMPLE 5

In Example 5, a non-single-crystal solar cell was manufactured in the same way as in Example 1 except that the film formation condition of the i-type semiconductor layer was changed in accordance with the following method.

In Example 1, after about 10 hours from the start of film formation, when the self-bias voltage value of the i-type semiconductor layer reached −1.5 V, the condition of the output value of the RF power source 315 was changed from 1,000 W to 1,100 W. After the setting change, the self-bias voltage value became −2.2 V. Then, the film formation was continued.

In this example, the film formation was continued after the change of the power source output value. When the self-bias voltage value of the i-type semiconductor layer reached −3.5 V, the condition of the output value of the RF power source 315 was changed from 1,100 W to 1,200 W. That is, the threshold at the time of the first change was set to −1.5 V, and the threshold at the time of the second change was set to −3.5 V. After the film formation for one roll was completed, the electrodes were formed as in Example 1 to manufacture the solar cell.

The evaluation of the solar cell was performed in the same way as in Example 1. As a result, as in the result of the first change of the power source output value, the short-circuit current of the solar cell manufactured in Example 5 was recovered after the second change of the power source output value. Accordingly, the effect according to the present invention was confirmed.

EXAMPLE 6

In Example 6, first, the film formation was performed under the same conditions as those in Comparative Example 1, so that the solar cell for one roll was manufactured. The result confirmed that the self-bias voltage gradually lowered as seen in Comparative Example 1, and the short-circuit current decreased.

Thereafter, the pressure in each of the reaction vessels was returned to the atmospheric pressure once, and the film deposited on the cathode electrode was removed by sand blasting. Then, film formation for the next roll was started.

At the start of film formation, the self-bias voltage value of the i-type semiconductor layer had been returned to the initial value, and the short-circuit current of a newly manufactured solar cell had been recovered. Accordingly, it was confirmed that: the relation between the self-bias voltage and the short-circuit current was previously obtained; and the threshold of the self-bias voltage was set such that the short-circuit current was in a desired range, whereby an exact maintenance timing was able to be determined with the aim of not lowering film characteristics.

This application claims priority from Japanese Patent Application No. 2004-153045 filed May 24, 2004, which is hereby incorporated by reference herein.

What is claimed is:

1. A method of forming a deposited film comprised of a Group IV semiconductor element by chemical vapor deposition which comprises:

introducing a starting gas into a discharge space in a reaction vessel; and applying electric power to generate discharge to decompose the starting gas, wherein, when a self-bias voltage value which is generated at an electrode applied with first electric power reaches a preset threshold, second electric power higher than the first electric power is applied to the electrode to change the self-bias voltage value to another self-bias voltage value larger in absolute value than the threshold, and when the self-bias voltage value which is generated at the electrode applied with the first electric power is changed from a first self-bias voltage value to a second self-bias voltage value and then the second self-bias voltage value reaches the threshold, the second electric power higher than the first electric power is applied to the electrode to change the self-bias voltage value to another self-bias voltage value larger in absolute value than the first self-bias voltage value and the second self-bias voltage value, and the deposited film is formed.

* * * * *